United States Patent

Wheatley, Jr. et al.

[11] Patent Number: 5,927,191
[45] Date of Patent: *Jul. 27, 1999

[54] APPARATUS FOR SCREEN PRINTING DIGITALIZED IMAGES

[75] Inventors: Raymond T. Wheatley, Jr., High Point; Brian J. Pendry, Archdale, both of N.C.

[73] Assignee: Finch Industries, Incorporated, Thomasville, N.C.

[*] Notice: This patent issued on a continued prosecution application filed under 37 CFR 1.53(d), and is subject to the twenty year patent term provisions of 35 U.S.C. 154(a)(2).

[21] Appl. No.: 08/758,201

[22] Filed: Nov. 25, 1996

Related U.S. Application Data

[51] Int. Cl.$^6$ .......................................................... B41C 1/14
[52] U.S. Cl. ........................................ 101/128.4; 101/129
[58] Field of Search ................................ 101/114, 128.21, 101/128.4, 129, 401.1, 463.1; 347/232; 358/298

[56] References Cited

U.S. PATENT DOCUMENTS

| | | | |
|---|---|---|---|
| 3,643,597 | 2/1972 | Lala | 101/128.21 |
| 3,934,503 | 1/1976 | Kinney et al. | 101/128.4 |
| 4,143,183 | 3/1979 | Rupp et al. | 101/123 |
| 4,402,262 | 9/1983 | Handforth | 101/129 |
| 4,682,271 | 7/1987 | Yamada | 101/129 |
| 5,121,131 | 6/1992 | Bouldin et al. | 101/463.1 |
| 5,156,089 | 10/1992 | McCue et al. | 101/128.4 |
| 5,179,448 | 1/1993 | Steinhardt et al. | 101/463.1 |
| 5,497,699 | 3/1996 | Mather | 101/128.4 |

*Primary Examiner*—Stephen R. Funk
*Attorney, Agent, or Firm*—Rhodes Coats & Bennett, L.L.P.

[57] ABSTRACT

A method and apparatus for screen printing a converted digitalized image onto a hard surface, such as glass or a mirror. The apparatus includes a source for providing a conventional digitalized image, such as a digital scanner, digital camera or CD-ROM. A computer-assisted enhancer is connected to the digitalized image source and adapted to select the size and shape of the halftones comprising the digitalized image as a function of a preselected screen size for screen printing and to provide a converted digitalized image. In the preferred embodiment, the ratio of the mesh size to screen frequency (lpi) is about 3. A dry film printer prints the converted digitalized image onto a transparent film which is used to prepare the screens for printing. In the preferred embodiment, the screen printing inks are selected from the group consisting of UV-cured, air-cured epoxy, and heat-cured lacquer for screen printing the converted digitalized image onto the hard surface.

7 Claims, 1 Drawing Sheet

APPARATUS FOR SCREEN PRINTING DIGITALIZED IMAGES

BACKGROUND OF THE INVENTION (1) Field of the Invention

The present invention relates generally to screen printing and, more particularly, to a method and apparatus for screen printing a digitalized image on hard surfaces, such as glass or a mirror.

(2) Description of the Prior Art

The conventional technique for painting or decorating hard surfaces such as glass, a mirror or ceramic surfaces is by screen printing. In a typical screen printing operation, a separate screen is made for each color to be applied. A first screen is brought into registry with the glass or ceramic surface and a first color painted thereon. A second, third, and fourth screen, if necessary, each representing different colors, is then brought into registry with the surface and the additional colors painted or brushed thereon through the pattern in the screen. One serious disadvantage to such prior art screen printing techniques is halftones have not been achieved by screen printing and therefore true replicas of patterns or scenes have not been possible except by prohibitively expensive photographic means.

In the textile industry, the problems associated with screen printing have been overcome, to some extent, by a process known as "heat-transfer printing" in which a carrier consisting usually of paper or aluminum foil is printed with sublimable dyes temporarily affixed to the carrier by the use of binders. The carrier so printed is then laid with the printed side adjacent the fabric to be printed, and is then heated under pressure to a temperature in the range of 160° C. to 220° C. on the unprinted side of the carrier to sublime the dyes onto the fabric.

Heat-transfer printing techniques have been attempted onto a wide variety of sheet-like articles such as wood, metals, glass, ceramics, and certain synthetic resins by providing such articles with a surface layer or coating of a thermoplastic resin which adheres to the surface of the substrate and accepts the sublimable dyes. See German patent application DOS No. 2,642,350; French Pat. No. 2,230,794; and British Pat. No. 1,517,832. Similarly the surface of the article to be printed may be coated with a thermosetting resin (published European patent application No.14,901) which receives the dyes. Characteristic of all of the above approaches is that the transfer of the dyes by sublimation onto the thermosetting or thermoplastic resin is effected by means of heat supplied or generated by an external source.

While the above described techniques temporarily result in a somewhat satisfactory product with the dyes affixed to the resinous layer, which in turn is deposited on the glass or ceramic surface, serious problems have been observed. First of all, the thermosetting and/or thermoplastic resin tends to release from nonmetallic, inorganic surfaces such as glass or ceramic in the presence of moisture, such as would be present during washing, in bathrooms, or on items subjected to the outside elements. As the resinous coating peels away from the glass or ceramic surface, the decorative pattern vanishes. Further, disperse dyes tend to fade when subjected to sunlight. Also, when the disperse dyes are applied to a resinous coating on glass or ceramic surfaces, the disperse dyes oxidize after a short period of time. When oxidized, the surface becomes distorted and a large percentage of the inks rise to the surface and spread. These inks can be readily wiped off and the decorative pattern is lost.

One approach to avoiding these problems is described in U.S. Pat. No. 4,842,613, issued to Purser, in which the decorative pattern is applied to the back of a transparent sheet of glass and oxidation of the disperse dyes is prevented by applying a seal coat of a protective material such as lacquer, varnish or clear resin. However, this approach is much more costly than conventional screen printing.

Thus, there remains a need for a new and improved method and apparatus for screen printing images on either side of a sheet of hard material, such as glass or a mirror, while, at the same time, producing true replicas of patterns or scenes which have not previously been possible.

SUMMARY OF THE INVENTION

The present invention is directed to a method and apparatus for screen printing a converted digitalized image onto a hard surface, such as glass or a mirror. The apparatus includes a source for providing a conventional digitalized image, such as a digital scanner, digital camera or CD-ROM. A computer-assisted enhancer is connected to the digitalized image source and adapted to select the size and shape of the printed output comprising the digitalized image as a function of a preselected screen size for screen printing and to provide a converted digitalized image. In the preferred embodiment, the ratio of the mesh size to screen frequency (lpi) is about 3.

A dry film printer prints the converted digitalized image onto a transparent film which is used to prepare the screens for printing. In the preferred embodiment, the screen printing inks are selected from the group consisting of UV-cured, air-cured epoxy, and heat-cured lacquer for screen printing the converted digitalized image onto the hard surface.

Accordingly, one aspect of the present invention is to provide an apparatus for screen printing a converted digitalized image. The apparatus includes: (a) a source for providing a digitalized image; (b) a computer-assisted enhancer connected to the digitalized image source and adapted to select the size and shape of the printed output comprising the digitalized image as a function of a preselected screen size for screen printing and to provide a converted digitalized image; and (c) a printer for printing the converted digitalized image onto a transparent film.

Another aspect of the present invention is to provide a computer-assisted digitalized image enhancer for converting a digitalized image from a source of a digitalized image to a transparent film printer for subsequent use in screen printing. The apparatus includes: (a) an input means connected to the source for providing a digitalized image; (b) a processor connected to the input means and adapted to select the size and shape of the printed output comprising the digitalized image as a function of a preselected screen size for screen printing and to provide a converted digitalized image, wherein the ratio of the mesh size to screen frequency (lpi) is about 3; and (c) an output means connected to the processor for providing the converted digitalized image output to the printer for printing the converted digitalized image.

Still another aspect of the present invention is to provide an apparatus for screen printing a converted digitalized image. The apparatus includes: (a) a source for providing a digitalized image; (b) a computer-assisted enhancer connected to the digitalized image source and adapted to select the size and shape of the printed output comprising the digitalized image as a function of a preselected screen size for screen printing and to provide a converted digitalized image, wherein the ratio of the mesh size to screen frequency (lpi) is about 3; (c) a printer for printing the converted digitalized image onto a transparent film; and (d) an ink selected from the group consisting of UV-cured, air-cured epoxy, and heat-cured lacquer for screen printing the converted digitalized image onto a hard surface.

These and other aspects of the present invention will become apparent to those skilled in the art after a reading of the following description of the preferred embodiment when considered with the drawings.

DESCRIPTION OF THE PREFERRED EMBODIMENTS

Figure 1:
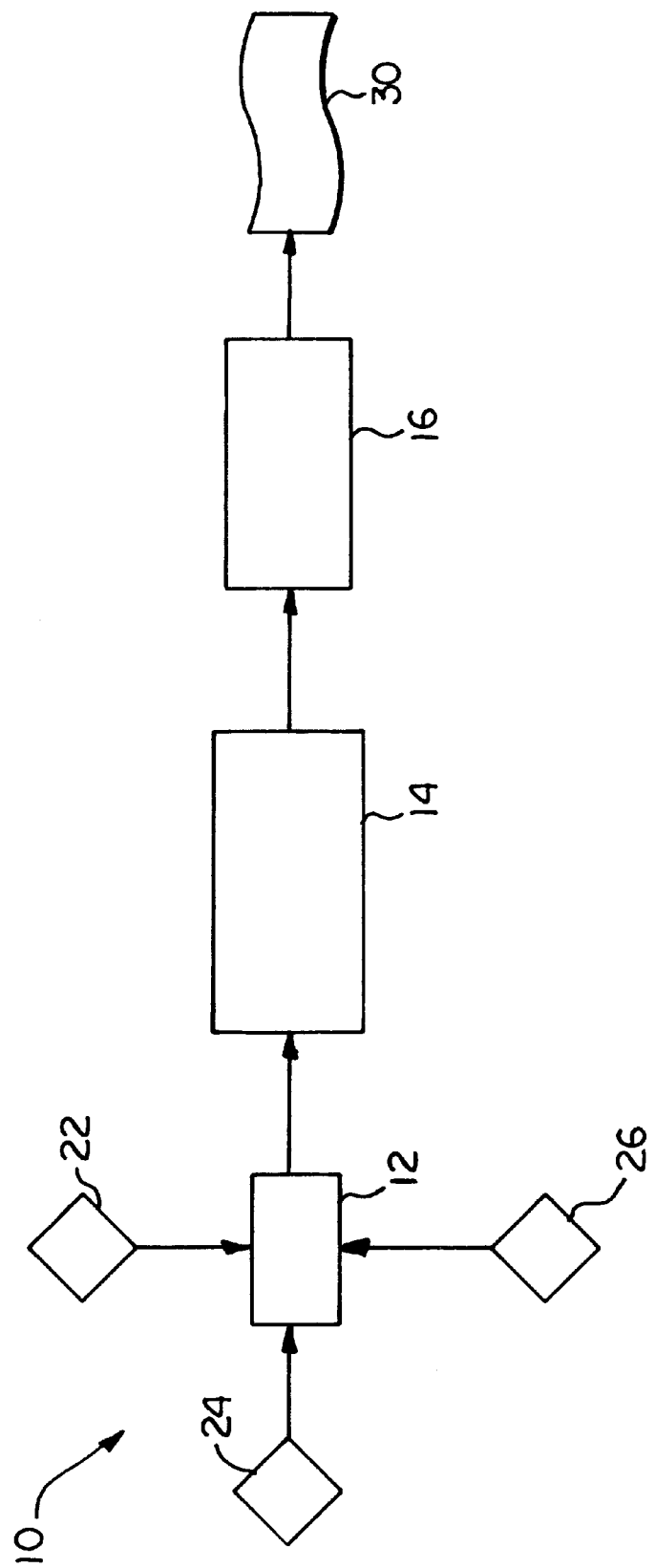
FIG. 1 is a block diagram illustrating a digitalized image screen printing system constructed according to the present invention.

In the following description, like reference characters designate like or corresponding parts throughout the several views. Also in the following description, it is to be understood that such terms as "forward", "rearward", "left", "right", "upwardly", "downwardly", and the like are words of convenience and are not to be construed as limiting terms.

Referring now to the drawings in general and FIG. 1 in particular, it will be understood that the illustrations are for the purpose of describing a preferred embodiment of the invention and are not intended to limit the invention thereto. As best seen in FIG. 1, a digitalized image screen printing system, generally designated 10, is shown constructed according to the present invention. The apparatus allows printing a digitalized image 12 onto a transparent dry film 30 which is then used to create a silk screen for screen printing using conventional emulsion methods.

The image to be screen-printed may be digitalized by a flat bed digital scanner 22 (or digital camera) which allows a preexisting image to be scanned and converted into a digital format and stored on some electronic media such as a diskette, a hard disk drive or CD-ROM. The resulting images are stored digitally as a series of pixels. The number of pixels per inch (ppi) of the original image determines the maximum resolution which can subsequently be obtained.

Alternatively, the source of the digitalized image may be clip art contained on a commercially available CD ROM 24. Another alternative for the source of the digital image 12 may be a commercially available digitizer 26, for example a Wacom Tablet, which allows a user to "sketch" a preexisting image into a digitalized format by hand tracing or creating an original image.

A computer-assisted enhancer 14 is used to manipulate the digital image 12 to achieve the halftones or color separations that are suitable for screen printing on hard surfaces, such as glass or a mirror.

The computer-assisted enhancer 14 is comprised of a commercially available personal computer, sold for example, as Macintosh 8500/130 with 270 megabytes of random access memory. Given the relatively large size of the electronic files for a digital image 12, a peripheral memory storage device, sold for example, as a Syquest 200 hard drive, may be used to store the digital image 12. Commercially available graphics art software packages, sold, for example, as Macromedia Freehand, Adobe Photoshop 3.0, Adobe Illustrator, Paint Alchemy and Power Cadd, and commercially available imaging filters, sold for example, as Kaos Tools and KPT Tools, are used to adjust the size and the shapes of the separations and resolution according to the present invention.

When printing halftones, the computer-assisted enhancer 14 is used to manipulate the screen frequency (lpi) which refers to the number of halftone cells per inch in the digital image 12 based on the size of the screen mesh that will ultimately be used to screen print the digital image 12. It has been discovered that, for halftones, the ratio of mesh size to screen frequency (lpi) should be about 3. Less than about 3 reduces resolution but greater than about 3 does not substantially add to resolution.

The preferred range of screen frequency for the halftones is between about 45 lpi to 65 lpi. This permits the use of screens from about 156 to 260 mesh. Because of the abrasive nature of glass and other hard surfaces, 260 mesh appears to be the upper practical limit for screen printing on such surfaces. This corresponds, according to the present invention, to a upper practical resolution of about 450 dpi. For simpler designs having a resolution of about 125 dpi, a screen of about 76 mesh performs satisfactory. Thus, it also has been discovered that the ratio of mesh size to desired dpi resolution should be about 0.6 up to the upper mesh size of about 260 mesh. Accordingly, the present invention is able to produce a non-photographically screen printed image on a hard surface having identifiable individual features of between about 125 to 450 dpi. The shapes of the dots of the printed output may be elliptical, square, round, or random, with a random shape being preferred.

The actual digitalization process for producing multicolor separations is performed on the computer and then printed out on separate dry film sheets.

The dry film printer 16, sold, for example as Ecographics by Calcomp, prints the digital image 12 onto a transparent dry film 30. The printer 16 preferably is capable of printing output having a resolution of between about 400×400 dots per inch (dpi). The detail of the printed image, for halftones, results from a combination of resolution (ppi/dpi) and screen frequency (lpi). A resolution of 400 dpi generally corresponds to about 65 lpi for halftones.

In the preferred embodiment, the transparent dry film 30 consists of a plastic film substrate selected from the group consisting of MYLAR® polyester film or acetate, with acetate being preferred. Other specially coated heat-sensitive films could also be used.

The inks used to screen-print the digital image 12 onto a hard surface, such as glass or a mirror, are chosen from the group consisting of heat-cured lacquer, UV-cured and air-cured epoxy inks that are commercially available from Cudner O'Connor, Nazdar, Delta Labs and Actinic. Heat-cured lacquer is preferred for more detailed images since air-cured epoxy is generally useful only up to about 156 mesh before the working time becomes unacceptable due to screen blockage and conventional UV-cured inks are too easily abraded during the mirroring process.

In operation, the digital image 12 is transmitted to a computer-assisted enhancer 14, which manipulates and transforms the halftones or separates the colors comprising the digitalized image 12 and outputs the converted image to the printer 16. Using a heated print head, the printer 16 prints the digitalized image 12 on the transparent dry film 30. The transparent film 30 is then used to create a silk screen using conventional emulsion methods. Finally, the image 12 is screen printed using inks selected according to the present invention onto a hard surface, such as glass or a mirror using conventional screen printing techniques.

Certain modifications and improvements will occur to those skilled in the art upon a reading of the foregoing description. By way of example, while halftones and 3 color separation (the mirror itself may be used to provide a 4th "color") is preferred, 5 or more colors may be used depending on the detail required to produce the final printed image. Also, unmirrored glass and other hard surfaces or films could also be printed. It should be understood that all such modifications and improvements have been deleted herein for the sake of conciseness and readability but are properly within the scope of the following claims.

We claim:

1. An apparatus for providing a film positive for screen printing a converted digitalized image onto hard, abrasive surfaces, including a sheet of glass or a mirror, said apparatus comprising:

(a) a source for providing a digitalized image;

(b) a computer-assisted enhancer connected to said digitalized image source for selecting half tones comprising said digitalized image as a function of a preselected screen mesh size for screen printing and to provide a converted digitalized image wherein the ratio of the screen mesh size to screen frequency (lpi) of said converted digitalized image is about 3 and the upper limit of said preselected screen mesh size is less than about 260 mesh; and (c) a dry film thermal printer including a transparent dry film supply for printing said converted digitalized image onto said transparent dry film.

2. The apparatus according to claim 1, wherein said source for providing said digitalized image is a digital scanner.

3. The apparatus according to claim 1, wherein said source for providing said digitalized image is a CD-ROM.

4. The apparatus according to claim 1, wherein said source for providing said digitalized image is a hand drawn image with a digitalizer.

5. The apparatus according to claim 1, wherein said printer produces a resolution of about 400 by 400 dpi.

6. The apparatus according to claim 1, wherein said transparent dry film is selected from the group consisting of polyester, acetate and heat sensitive films.

7. The apparatus according to claim 1, wherein said converted digitalized image output consists of a screen frequency between about 45 lpi to 65 lpi.

* * * * *